US012591508B2

(12) United States Patent
Lai et al.

(10) Patent No.: US 12,591,508 B2
(45) Date of Patent: Mar. 31, 2026

(54) NON-VOLATILE MEMORY AND ASSOCIATED CONTROL METHOD

(71) Applicant: eMemory Technology Inc., Hsin-Chu (TW)

(72) Inventors: Tsung-Mu Lai, Hsinchu County (TW); Chang-Chun Lung, Hsinchu County (TW); Chia-Jung Hsu, Hsinchu County (TW); Cheng-Yen Shen, Hsinchu County (TW); Ching-Yuan Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 253 days.

(21) Appl. No.: 18/602,059

(22) Filed: Mar. 12, 2024

(65) Prior Publication Data

US 2024/0320138 A1 Sep. 26, 2024

Related U.S. Application Data

(60) Provisional application No. 63/453,182, filed on Mar. 20, 2023.

(51) Int. Cl.
*G11C 11/34* (2006.01)
*G06F 12/02* (2006.01)
*H10B 43/35* (2023.01)
*H10D 30/69* (2025.01)
*H10D 64/01* (2025.01)

(52) U.S. Cl.
CPC ......... *G06F 12/0223* (2013.01); *H10B 43/35* (2023.02); *H10D 30/69* (2025.01); *H10D 30/694* (2025.01); *H10D 64/037* (2025.01)

(58) Field of Classification Search
CPC .... G05F 12/0223; H10B 43/35; H10D 30/69; H10D 64/037; H10D 30/694
USPC ...................................... 365/185.24
See application file for complete search history.

(56) References Cited

U.S. PATENT DOCUMENTS

| | | | | |
|---|---|---|---|---|
| 6,396,740 B1 | 5/2002 | Chih et al. | | |
| 7,236,402 B2 * | 6/2007 | Suhail | ................ | G11C 16/3436 |
| | | | | 365/185.22 |
| 7,468,914 B2 * | 12/2008 | Toda | .................... | G11C 11/5642 |
| | | | | 365/185.03 |
| 8,456,911 B2 * | 6/2013 | Yuan | ..................... | G11C 16/26 |
| | | | | 365/185.11 |

(Continued)

OTHER PUBLICATIONS

N. Wang et al., "A Million Cycle 0.13um 1Mb Embedded SONOS Flash Memory Using Successive Approximated Read Calibration", IEEE 2008 Custom Intergrated Circuits Conference (CICC).

*Primary Examiner* — Viet Q Nguyen
(74) *Attorney, Agent, or Firm* — WPAT, PC

(57) ABSTRACT

A control method for a non-volatile memory is provided. After the non-volatile memory is enabled, a judging step is performed to judge whether the non-volatile memory enters a read mode, a program mode or an erase mode. If the judging result indicates that the non-volatile memory enters the read mode, the program mode or the erase mode, a worst threshold voltage of plural reference cells of the non-volatile memory is searched. Then, at least one of a control voltage for read action, a control voltage for program verify and a control voltage for erase verify is determined. Then, a read action, a program action or an erase action is performed on plural data cells of the non-volatile memory.

24 Claims, 7 Drawing Sheets

(56)     References Cited

U.S. PATENT DOCUMENTS

| 8,514,629 | B2 * | 8/2013 | Goda | ..................... | G11C 16/06 |
| | | | | | 365/185.11 |
| 8,971,121 | B2 * | 3/2015 | Goda | ..................... | G11C 16/10 |
| | | | | | 365/185.11 |
| 9,036,416 | B2 * | 5/2015 | Mokhlesi | ........... | G11C 16/3404 |
| | | | | | 365/201 |
| 2009/0319722 | A1 | 12/2009 | Murin et al. | | |

* cited by examiner

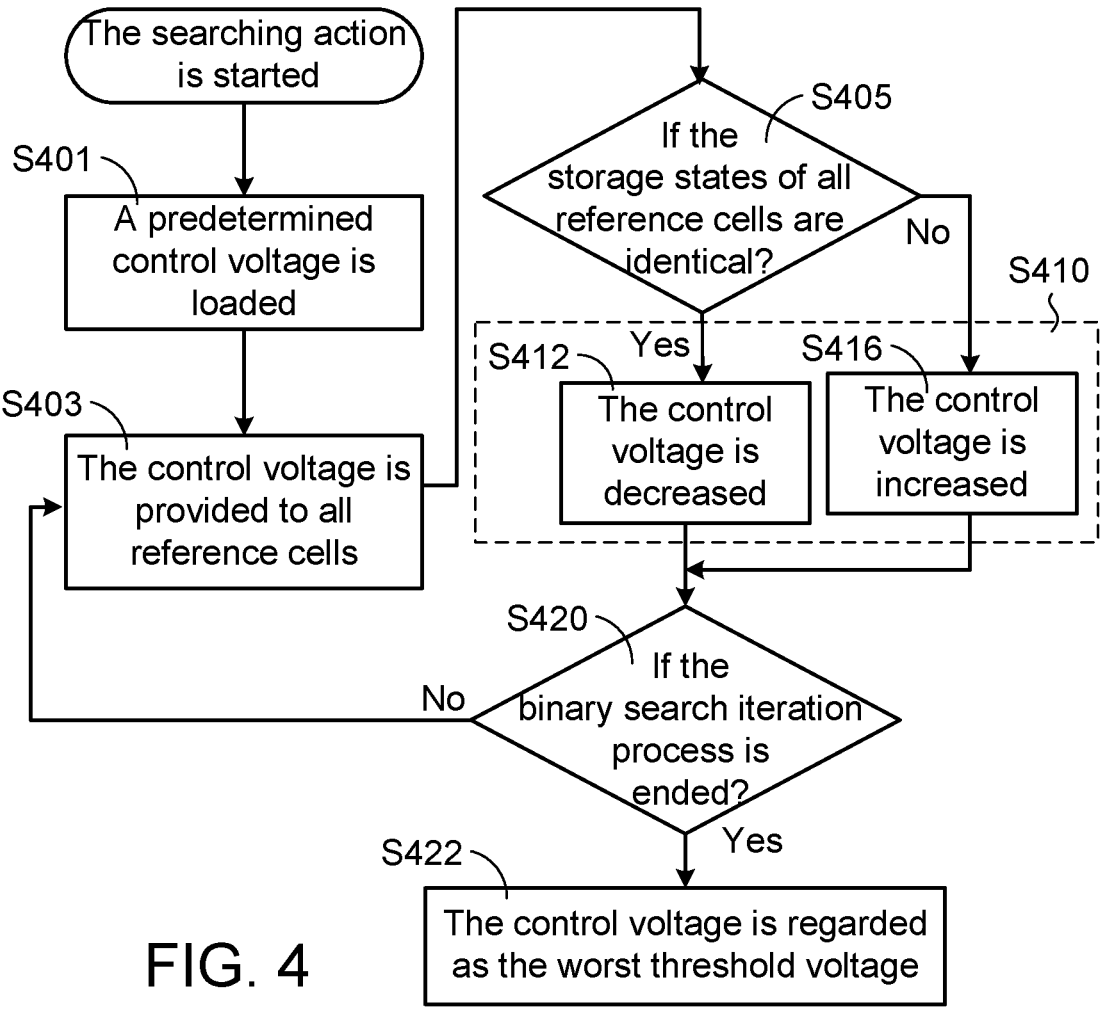
FIG. 4
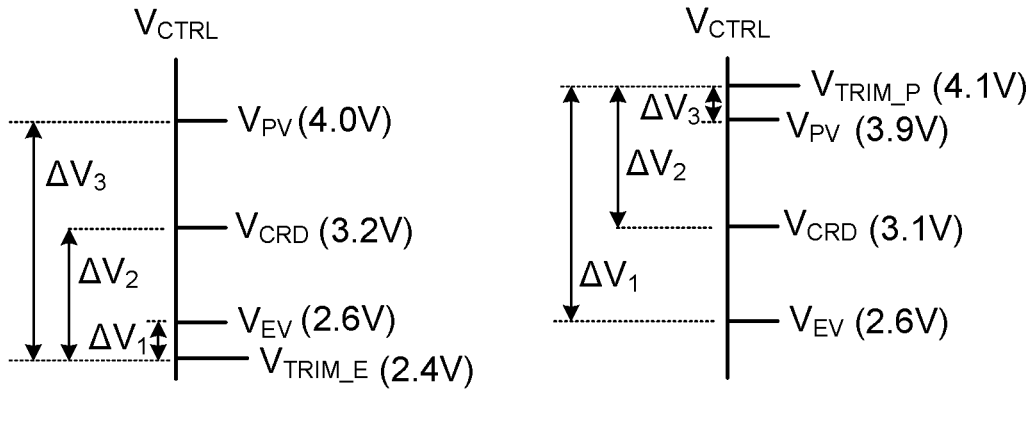
FIG. 5A                    FIG. 5B

NON-VOLATILE MEMORY AND ASSOCIATED CONTROL METHOD

This application claims the benefit of U.S. provisional application Ser. No. 63/453,182, filed Mar. 20, 2023, the subject matters of which are incorporated herein by references.

FIELD OF THE INVENTION

The present invention relates to a non-volatile memory (NVM) and a control method for the non-volatile memory and more particularly to a non-volatile memory with reference cells and a control method for adjusting the control voltage in various operating modes according to the characteristics of the reference cells.

BACKGROUND OF THE INVENTION

As is well known, a non-volatile memory is able to continuously retain data after the supplied power is interrupted. Consequently, non-volatile memories have been widely applied to various electronic products.

Generally, a memory cell of a non-volatile memory comprises a storage device. For example, the storage device comprises a floating gate transistor or a SONOS transistor. Hereinafter, a P-type floating gate transistor and a P-type SONOS transistor will be taken as examples for illustration.

FIGS. 1A, 1B and 1C are schematic circuit diagrams of various memory cells of a non-volatile memory cell.

As shown in FIG. 1A, the memory cell comprises a select transistor $M_{SEL}$ and a floating gate transistor $M_F$. The floating gate transistor $M_F$ is a stacked-gate floating gate transistor. In addition, the floating gate transistor $M_F$ is a storage device. The first drain/source terminal of the select transistor $M_{SEL}$ is connected with a source line SL. The gate terminal of the select transistor $M_{SEL}$ is connected with a word line WL. The first drain/source terminal of the floating gate transistor $M_F$ is connected with the second drain/source terminal of the select transistor $M_{SEL}$. The second drain/source terminal of the floating gate transistor $M_F$ is connected with a bit line BL. The two gates of the floating gate transistor $M_F$ are a control gate and a floating gate 12, respectively. In addition, the control gate is connected to a control line CL.

As shown in FIG. 1B, the memory cell comprises a select transistor $M_{SEL}$, a floating gate transistor $M_F$ and a capacitor C. The floating gate transistor $M_F$ is a single-gate floating gate transistor. The floating gate transistor $M_F$ and the capacitor C are collaboratively formed as a storage device. The first drain/source terminal of the select transistor $M_{SEL}$ is connected to a source line SL. The gate terminal of the select transistor $M_{SEL}$ is connected with a word line WL. The first drain/source terminal of the floating gate transistor $M_F$ is connected with the select transistor $M_{SEL}$. The second drain/source terminal of the floating gate transistor $M_F$ is connected with a bit line BL. A floating gate 14 of the floating gate transistor $M_F$ is connected to a first terminal of the capacitor C. A second terminal of the capacitor C is connected to a control line CL.

Generally, the floating gates 12 and 14 of the floating gate transistor $M_F$ can store hot carriers, e.g., electrons. When proper bias voltages are provided to the word line WL, the control line CL, the source line SL and the bit line BL, the memory cell can be subjected to a program action or an erase action. For example, when the program action is performed on the memory cell, hot carriers are injected into the floating gate 12 (or 14). Consequently,) the memory cell is in a programmed state. When the erase action is performed on the memory cell, hot carriers are ejected from the floating gate 12 (or 14). Consequently, the memory cell is in an erased state.

As shown in FIG. 1C, the memory cell includes a select transistor $M_{SEL}$ and a SONOS transistor $M_{ONO}$. A gate dielectric layer 16 of the SONOS transistor $M_{ONO}$ is a stack structure of an oxide layer, a nitride layer and an oxide layer. In addition, the SONOS transistor $M_{ONO}$ is a storage device. The first drain/source terminal of the select transistor $M_{SEL}$ is connected with a source line SL. The gate terminal of the select transistor $M_{SEL}$ is connected with a word line WL. The first drain/source terminal of the SONOS transistor $M_{ONO}$ is connected with the second drain/source terminal of the select transistor $M_{SEL}$. The second drain/source terminal of the SONOS transistor $M_{ONO}$ is connected with a bit line BL. The gate terminal of the SONOS transistor $M_{ONO}$ is connected with a control line CL.

In the SONOS transistor $M_{ONO}$, the nitride layer of the stack structure in the gate dielectric layer 16 can store hot carriers. When proper bias voltages are provided to the word line WL, the control line CL, the source line SL and the bit line BL, the memory cell can be subjected to a program action or an erase action. For example, when the program action is performed on the memory cell, hot carriers are injected into the nitride layer. Consequently, the memory cell is in a programmed state. When the erase action is performed on the memory cell, hot carriers are ejected from the nitride layer. Consequently, the memory cell is in an erased state.

Generally, the threshold voltage of the floating gate transistor $M_F$ and the threshold voltage of the SONOS transistor $M_{ONO}$ are determined according to the amount of the stored hot carriers. That is, the threshold voltages of the floating gate transistor $M_F$ in the programmed state and the erasing stated are different, and the threshold voltages of the SONOS transistor $M_{ONO}$ in the programmed state and the erasing stated are different. When a read action is performed, a control voltage is provided to the control line CL of the storage device. According to the result of judging whether the storage device is turned on or according to a cell current generated in the bit line BL, the storage state of the memory cell is determined.

It is noted that the circuitry structure of the memory cell is not restricted. The storage device may be a P-type transistor or an N-type transistor. For example, in another circuitry structure of the memory cell, the first drain/source terminal of the select transistor $M_{SEL}$ is connected with the bit line BL, the gate terminal of the select transistor $M_{SEL}$ is connected with the word line WL, the first drain/source terminal of the storage device is connected with the second drain/source terminal of the select transistor $M_{SEL}$, the second drain/source terminal of the storage device is connected with the source line SL, and the control line CL is connected with the storage device of the memory cell. In another circuitry structure, the memory cell comprises a select transistor, a switch transistor and a storage device. The three transistors are connected between the source line SL and the bit line BL.

The threshold voltage of the storage device in the erased state is $V_{thE}$, and the threshold voltage of the storage device in the programmed state is $V_{thP}$, wherein $V_{thP}$ is higher than $V_{thE}$. According to the present invention, the programmed state represents the injection of negative carriers into the storage device, and the erased state represents the removal of negative carriers from the storage device. It can also be said that the programmed state represents the removal of the positive carriers from the storage device, and the erased state represents the injection of positive carriers into the storage device. For example, negative carriers are electrons, and positive carriers are holes. In a read action, the control voltage $V_{CTRL}$ is in the range between $V_{thP}$ and $V_{thE}$. When the memory cell is in the erased state, the control voltage $V_{CTRL}$ for read action is higher than $V_{thE}$. Consequently, the memory cell is turned off, and the cell current in the bit line BL is very low (or nearly zero). Whereas, when the memory cell is in the programmed state, the control voltage $V_{CTRL}$ for read action is lower than $V_{thP}$. Consequently, the memory cell is turned on, and the cell current in the bit line BL is relatively higher. That is, when the read action is performed and the proper control voltage $V_{CTRL}$ is provided to the memory cell, the storage state of the memory cell is determined according to the magnitude of the cell current in the bit line BL.

In the memory cell of the non-volatile memory, the characteristics of the storage device will deteriorate with the increase of the program/erase (P/E) cycling count. Moreover, with the increase of the data retention time, the characteristics ($V_{thP}$ and $V_{thE}$) of the storage device are deteriorated.

FIGS. 2A and 2B are plots illustrating the changes of the characteristics of the storage device in the memory cell of the non-volatile memory.

In the plot of FIG. 2A, the relationship between the P/E cycling count and the threshold voltage of the storage device is shown. When the non-volatile memory is just finished wafer sorting, the P/E cycling count of the storage device is very low. At this time, the threshold voltage $V_{thE}$ of the storage device in the erased state is lower (e.g., about 2.2V), and the threshold voltage $V_{thP}$ of the storage device in the programmed state is higher (about 4.8V). When the P/E cycling count of the storage device is very high (e.g., 10000 counts), the threshold voltage $V_{thE}$ of the storage device in the erased state will be increased (e.g., about 2.8V), and the threshold voltage $V_{thP}$ of the storage device in the programmed state will be decreased (e.g., about 4.2V).

In the plot of FIG. 2B, the relationship between the data retention time and the threshold voltage of the storage device is shown. After the storage device has been programmed into the programmed state for 1000 hours in the ambient temperature of 150° C., the threshold voltage $V_{thP}$ of the storage device is decreased from about 4.6V to about 3.2V. After the storage device has been erased into the erased state for 1000 hours, the threshold voltage $V_{thE}$ of the storage device is decreased from about 2.6V to about 2.4V.

Due to the characteristics of the non-volatile memory, some problems are possibly generated. For example, if the control voltage $V_{CTRL}$ is set at a fixed value during the read action, it is easy to misjudge the storage state of the memory cell. For example, the control voltage $V_{CTRL}$ is set at 2.9V. Please refer to FIG. 2A. If the P/E cycling count of the storage device is very high (e.g., 10000 counts) and the control voltage $V_{CTRL}$ provided to the storage device is 2.9V, the storage device in either the programmed state or the erased state is possibly turned on. Consequently, the magnitude of the cell current is too large to be misjudged. Please refer to FIG. 2B. After the storage device has been programmed or erased for 1000 hours and the control voltage $V_{CTRL}$ provided to the control device is 2.9V, the storage device in either the programmed state or the erased state is possibly turned off. Consequently, the magnitude of the cell current is too small to be misjudged.

SUMMARY OF THE INVENTION

An embodiment of the present invention provides a control method for a non-volatile memory. The non-volatile memory includes a memory cell array. The memory cell array includes plural reference cells and plural data cells. The plural reference cells are maintained in a first storage state. The control method includes the steps of: (a1) judging whether the non-volatile memory enters a read mode, a program mode or an erase mode after the non-volatile memory is enabled; (a2) if a judging result of the step (a1) indicates that the non-volatile memory enters the read mode, the program mode or the erase mode, searching a worst threshold voltage of the plural reference cells; (a3) determining at least one of a control voltage for read action, a control voltage for program verify and a control voltage for erase verify according to the worst threshold voltage; and (a4) performing a read action, a program action or an erase action on the plural data cells; wherein when the erase action is performed, the plural data cells are changed to an erased state, and the plural reference cells are changed from the first storage state to a second storage state and then changed from the second storage state to the first storage state, and a program/erase cycling count of each of the plural reference cells is added by 1.

An embodiment of the present invention provides a control method for a non-volatile memory. The non-volatile memory comprises a memory cell array and a control voltage generator. The memory cell array comprises plural reference cells and plural data cells connected with the control voltage generator. Each of the plural reference cells and each of the plural data cells comprises a storage device, and the plural reference cells are maintained in a first storage state. The control method includes the steps of: (a1) searching a worst threshold voltage of the plural reference cells; (a2) determining at least one of a control voltage for read action, a control voltage for program verify and a control voltage for erase verify according to the worst threshold voltage; and (a3) providing the control voltage for read action to the memory cell array when a read action is performed, providing the control voltage for program verify to the memory cell array when a program verify process is performed, or providing the control voltage for erase verify to the memory cell array when an erase verify process is performed; wherein the step (a1) comprises steps of: (b1) controlling the voltage generator to load a predetermined voltage as a control voltage; (b2) providing the control voltage to the plural reference cells; (b3) judging whether the plural reference cells are in the first storage state; (b4) the control voltage generator adjusting the control voltage according to a judging result of the step (b3); (b5) judging whether a search process is ended; (b6) if a judging result of the step (b5) indicates that the search process is not ended, performing the step (b2) again; and, (b7) if the judging result of the step (b5) indicates that the search process is ended, determining the control voltage as the worst threshold voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 is a flowchart illustrating a method of performing a searching action by using a binary search iteration process;

FIG. 5A schematically illustrates the relationships between the control voltage for program verify ($V_{PV}$), the control voltage for read action ($V_{CRD}$), the control voltage for erase verify ($V_{EV}$) and the worst threshold voltage $TRIM\_E$;

FIG. 5B schematically illustrates the relationships between the control voltage for program verify ($V_{PV}$), the control voltage for read action ($V_{CRD}$), the control voltage for erase verify ($V_{EV}$) and the worst threshold voltage $TRIM\_P$;

DETAILED DESCRIPTION OF PREFERRED EMBODIMENTS

The present invention provides a non-volatile memory and a control method for the non-volatile memory. The non-volatile memory comprises reference cells. According to the changes of the characteristics of the reference cells, a control voltage $V_{CTRL}$ is dynamically adjusted according to the changes of the characteristics of the reference cells. In addition, the control voltage $V_{CTRL}$ is applied to a read action, a program verify process and an erase verify process. Hereinafter, the control voltage $V_{CTRL}$ applied to the read action is referred as a control voltage for read action ($V_{CRD}$), the control voltage $V_{CTRL}$ applied to the program verify process is referred as a control voltage for program verify ($V_{PV}$), and the control voltage $V_{CTRL}$ applied to the erase verify process is referred as a control voltage for erase verify ($V_{EV}$).

Figures 1A, 1B, 1C, 2A, 2B:
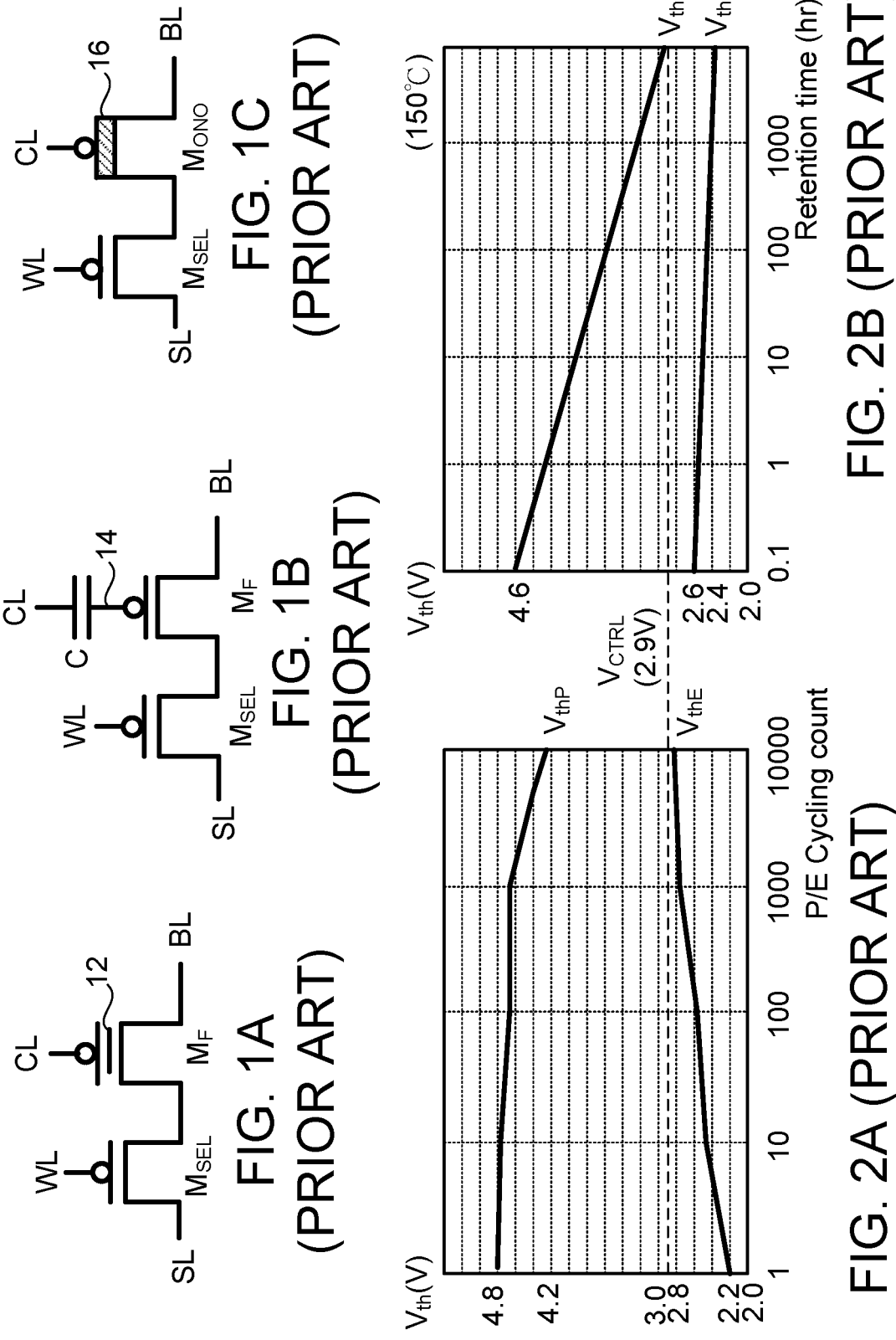
FIGS. 1A, 1B and 1C (prior art) are schematic circuit diagrams of various memory cells of a non-volatile memory cell.
FIGS. 2A and 2B (prior art) are plots illustrating the changes of the characteristics of the storage device in the memory cell of the non-volatile memory.

The abovementioned control voltage, i.e., the control voltage for read action ($V_{CRD}$), the control voltage for program verify ($V_{PV}$) or the control voltage for erase verify ($V_{EV}$), is transmitted to the memory cell of the non-volatile memory through a control line CL. The memory cell with the circuitry circuit shown in FIG. 1A, FIG. 1B or FIG. 1C or any other appropriate memory cell with the control line CL can be used as the reference cell or a data cell of a memory cell array in the non-volatile memory of the present invention.

Figures 3A, 3B:
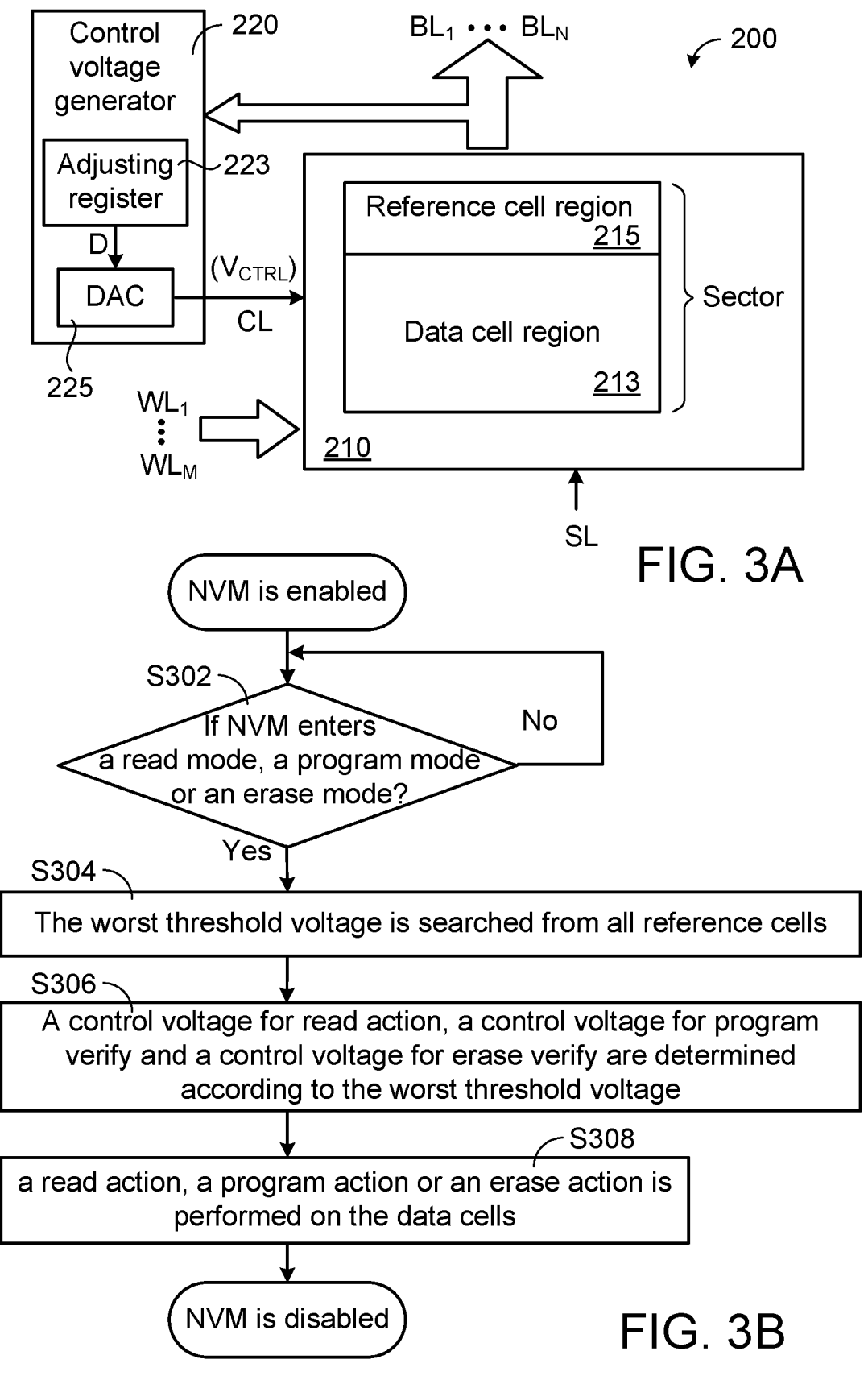
FIG. 3A is a schematic circuit block diagram illustrating a non-volatile memory according to an embodiment of the present invention.
FIG. 3B is a flowchart of a control method for the non-volatile memory according to the embodiment of the present invention.

FIG. 3A is a schematic circuit block diagram illustrating a non-volatile memory according to an embodiment of the present invention. As shown in FIG. 3A, the non-volatile memory 200 comprises a memory cell array 210 and a control voltage generator 220. The memory cell array 210 comprises a reference cell region 215 and a data cell region 213. The data cells in the data cell region 213 are used to store data that are inputted by an external host (not shown). When a searching action is performed, the control voltage $V_{CTRL}$ is adjusted by the control voltage generator 220, and the adjusted control voltage $V_{CTRL}$ is transmitted to the reference cells in the reference cell region 215. Consequently, the changes of the characteristics of the reference cells are traced.

The memory cell array 210 is connected with a source line SL, the control line CL, M word lines $WL_1 \sim WL_M$ and N bit lines $BL_1 \sim BL_N$. According to the activated word line of the word lines $WL_1 \sim WL_M$ and the activated bit line of the bit lines $BL_1 \sim BL_N$, the corresponding memory cell of the memory cell array 210 is a selected cell. That is, the selected cell is either any reference cell in the reference cell region 215 or any data cell in the data cell region 213. Furthermore, by providing proper bias voltages to the source line SL, the control line CL, the word lines $WL_1 \sim WL_M$ and the bit lines $BL_1 \sim BL_N$, a program action, an erase action or a read action can be selectively performed on the selected cell.

The control voltage generator 220 comprises a adjusting register 223 and a digital-to-analog converter (DAC) 225. The adjusting register 223 provides a digital number D to the DAC 225. According to the digital number D, the DAC 225 generates the control voltage $V_{CTRL}$ to the memory cell array 210 through the control line CL. In other words, by changing the digital number D in the adjusting register 223, the control voltage $V_{CTRL}$ outputted from the control voltage generator 220 is correspondingly adjusted.

Furthermore, in the memory cell array 210, the reference cells in the reference cell region 215 and the data cells in the data cell region 213 are collaboratively constituted as a sector. When the non-volatile memory 200 is subjected to a sector erase action, all memory cells in the sector are erased into the erased state. In addition, the program/erase (P/E) cycling count corresponding to the reference cells in the reference cell region 215 is added by 1. However, after the sector erase action is completed, the reference cells are possibly maintained in the erased state or programmed into the programmed state. According to the actual requirements, the reference cells can be set to maintain in the erased state or to maintain in the programmed state. Taking the reference cells maintained in the erased state as an example, the reference cells are initially set in the erased state before entering the read mode or the program mode or the erase mode.

FIG. 3B is a flowchart of a control method for the non-volatile memory according to the embodiment of the present invention.

After the non-volatile memory (NVM) 200 is enabled, the power system of the non-volatile memory 200 is ready. Meanwhile, the non-volatile memory 200 is in a standby state.

Then, a step S302 is performed to judge whether the non-volatile memory 200 enters a read mode, a program mode or an erase mode.

When the non-volatile memory 200 receives a control command from the host, the non-volatile memory 200 enters the read mode, the program mode or the erase mode according to the control command. Meanwhile, the judging condition of the step S302 is satisfied. Then, the non-volatile memory 200 performs a searching action to search the worst threshold voltage of all reference cells (Step S304). The worst threshold voltage is determined based on the storage state of the reference cells. According to the present invention, the lowest threshold voltage among all reference cells maintained in the programmed state can be considered as the worst threshold voltage. Conversely, the highest threshold voltage among all reference cells maintained in the erased state can be considered as the worst threshold voltage.

Then, a control voltage for read action ($V_{CRD}$), a control voltage for program verify ($V_{PV}$) and a control voltage for erase verify ($V_{EV}$) are determined according to the worst threshold voltage (Step S306). The control voltage for read action ($V_{CRD}$) is applied to the read action. The control voltage for program verify ($V_{PV}$) is applied to the program verify process. The control voltage for erase verify ($V_{EV}$) is applied to the erase verify process.

After the control voltage for read action ($V_{CRD}$), the control voltage for program verify ($V_{PV}$) and the control voltage for erase verify ($V_{EV}$) are confirmed, a read action, a program action or an erase action is selectively performed on the data cells in the data cell region 213 of the non-volatile memory 200 (Step S308). Then, the non-volatile memory 200 is disabled.

As mentioned above in the control method of FIG. 3B, whenever the non-volatile memory 200 enters the read mode, the program mode or the erase mode, the control voltage $V_{CTRL}$ is adjusted by the control voltage generator 220, and the changes of the characteristics of all reference cells in the reference cell region 215 are traced according to the adjusted control voltage $V_{CTRL}$. After the worst threshold voltage of all reference cells is searched, the control voltage for read action ($V_{CRD}$), the control voltage for program verify ($V_{PV}$) and the control voltage for erase verify ($V_{EV}$) are determined according to the worst threshold voltage.

Generally, after the memory cell in the memory cell array 210 has been programmed or erased for a long data retention time, the misjudgment problem possibly occurs because of the threshold voltage change. For solving the misjudgment problem, it is necessary to perform the program verify process on the programmed memory cell during the program action, so that the memory cell is in the high-quality programmed state. Similarly, it is necessary to perform the erase verify process on the erase memory cell during the erase action, so that the memory cell is in the high-quality erased state. In case that the storage device is a P-type transistor, the memory cell in the high-quality programmed state indicates that the threshold voltage $V_{thP}$ of the storage device is sufficiently high, and the memory cell in the high-quality erased state indicates that the threshold voltage $V_{thE}$ of the storage device is sufficiently low.

The control voltage generator 220 can provide the control voltage for read action ($V_{CRD}$), the control voltage for program verify ($V_{PV}$) and the control voltage for erase verify ($V_{EV}$). The control voltage for read action ($V_{CRD}$) is applied to the read action. The control voltage for program verify ($V_{PV}$) is applied to the program verify process. The control voltage for erase verify ($V_{EV}$) is applied to the erase verify process. Consequently, it can be assured that the memory cell is in the high-quality programmed state or the high-quality erased state. After a long data retention time, the correctness of the data in the memory cell is still satisfactory.

For example, the storage device is a P-type transistor. When the read action is performed, the control voltage generator 220 provides the control voltage for read action ($V_{CRD}$) to the control line CL of the selected cell. For example, the control voltage for read action ($V_{CRD}$) is 3.0V. If the selected cell is turned on and the magnitude of the select cell current is higher, it is determined that the selected cell is in the programmed state. That is, the threshold voltage $V_{thP}$ of the storage device is higher than the control voltage for read action ($V_{CRD}$). Whereas, if the selected cell is not turned on and the magnitude of the select cell is very low, it is determined that the selected cell is in the erased state. That is, the threshold voltage $V_{thE}$ of the storage device is lower than the control voltage for read action ($V_{CRD}$).

When the program verify process is performed, the control voltage generator 220 provides the control voltage for program verify ($V_{PV}$) to the control line CL of the selected cell. The control voltage for program verify ($V_{PV}$) is higher than the control voltage for read action ($V_{CRD}$). For example, the control voltage for program verify ($V_{PV}$) is 4.0V. If the selected cell is still determined to be in the programmed state, it means that the threshold voltage $V_{thP}$ of the storage device is higher than 4.0V. In other words, the memory cell is in the high-quality programmed state. Whereas, if the programmed state of the selected cell cannot be determined, it means that the threshold voltage $V_{thP}$ of the storage device is lower than 4.0V. In other words, the memory cell is not in the high-quality programmed state. Then, the program action and the program verify process are repeatedly performed on the selected cell until the selected cell passes the program verify process and the memory cell is determined to be in the high-quality programmed state.

Similarly, when the erase verify process is performed, the control voltage generator 220 provides the control voltage for erase verify ($V_{EV}$) to the control line CL of the selected cell. The control voltage for erase verify ($V_{EV}$) is lower than the control voltage for read action ($V_{CRD}$). For example, the control voltage for erase verify ($V_{EV}$) is 2.8V. If the selected cell is still determined to be in the erased state, it means that the threshold voltage $V_{thE}$ of the storage device is lower than 2.8V. In other words, the memory cell is in the high-quality erased state. Whereas, if the erased state of the selected cell cannot be determined, it means that the threshold voltage $V_{thE}$ of the storage device is higher than 2.8V. In other words, the memory cell is not in the high-quality erased state. Then, the erase action and the erase verify process are repeatedly performed on the selected cell until the selected cell passes the erase verify process and the memory cell is determined to be in the high-quality erased state.

After the program action or the erase action has been performed many times, the selected memory cell fails to pass the program verify process or the erase verify process. Under this circumstance, it is determined that the selected cell is in a program failure condition or an erase failure condition.

Especially, in the memory cell array 210 of the non-volatile memory 200, the characteristics of the reference cells in the reference cell region 215 are inferior to the characteristics of the data cells in the data cell region 213. For achieving this purpose, the P/E cycling count of the reference cell in the reference cell region 215 is larger than or equal to the P/E cycling count of the data cell in the data cell region 213.

In an example, the reference cells in the reference cell region 215 are maintained in the erased state. When the non-volatile memory 200 is subjected to the sector erase action, all reference cells in the reference cell region 215 are firstly subjected to the program action and programmed into the programmed state. Then, an erase action is performed, and all reference cells in the reference cell region 215 and all data cells of the data cell region 213 are erased into the erased state. Consequently, after the sector erase action is completed, all reference cells in the reference cell region 215 and all data cells of the data cell region 213 are erased into the erased state.

In another example, the reference cells in the reference cell region 215 are maintained in the programmed state. When the non-volatile memory 200 is subjected to the sector erase action, all reference cells in the reference cell region 215 and all data cells of the data cell region 213 are erased into the erased state. Then, all reference cells in the reference cell region 215 are subjected to the programmed action and programmed into the programmed state. Consequently, after the sector erase action is completed, all data cells of the data cell region 213 are erased into the erased state, and all reference cells in the reference cell region 215 are programmed into the programmed state.

As mentioned above, when the non-volatile memory 200 is subjected to the sector erase action, the storage states of the reference cells in the reference cell region 215 are temporarily changed, and then restored to the erased state or the programmed state. That is, whenever the sector erase action is performed on the non-volatile memory 200, the P/E cycling count of each reference cell in the reference cell region 215 of the memory cell array 210 is added by 1, but the P/E cycling count of each data cell in the data cell region 213 is not necessarily added by 1. In this way, it can be assured that the P/E cycling count of the reference cell in the reference cell region 215 is larger than or equal to the P/E cycling count of the data cell in the data cell region 213. In addition, the characteristics of the reference cells in the reference cell region 215 are inferior to the characteristics of the data cells in the data cell region 213.

Then, when the non-volatile memory 200 is subjected to any other action, the storage state of each reference cell in the reference cell region 215 is kept unchanged.

As mentioned above, in the memory cell array 210, the characteristics of the reference cells in the reference cell region 215 are inferior. When the searching action is performed, the control voltage $V_{CTRL}$ is adjusted by the control voltage generator 220, and the changes of the characteristics of all reference cells in the reference cell region 215 are traced according to the adjusted control voltage $V_{CTRL}$. In addition, the worst threshold voltage of all reference cells is searched. After worst threshold voltage is searched, it is almost confirmed that the reference cell with the worst threshold voltage is the memory cell with the worst characteristics in the memory cell array 210. The control voltages determined according to the memory cell with the worst characteristics and the worst threshold voltage are applied to the read action, the program verify process and the erase verify process. Consequently, the correctness of the data in the memory cells can be effectively enhanced.

FIG. 4 is a flowchart illustrating a method of performing the searching action by using a binary search iteration process. For illustration, the storage device is a P-type transistor, and the reference cell is maintained in the erased state.

After the searching action is started, a predetermined control voltage $V_{CTRL}$ is loaded into the control voltage generator 220 (Step S401), and the control voltage $V_{CTRL}$ is provided to all reference cells (Step S403). Then, a step S405 is performed to judge whether the storage states of all reference cells are identical. According to the judging result of the step S405, the control voltage $V_{CTRL}$ is adjusted by the control voltage generator 220 (Step S410).

In case that the storage device is the P-type transistor and the reference cells are maintained in the erased state, the step S405 is used to judge whether the storage states of all reference cells are the erased state. According to the judging result of the step S405, the control voltage $V_{CTRL}$ is adjusted (Step S410). If the storage states of all reference cells are the erased state, the magnitude of the control voltage $V_{CTRL}$ is decreased (Step S412). Whereas, if the reference cells are not all in the erased state, the magnitude of the control voltage $V_{CTRL}$ is increased (Step S416).

Then, a step S420 is performed to judge whether the number of iterations in the binary search iteration process is reached. For example, in an embodiment, 5 binary search iterations are required. If the number of iterations is smaller than 5, the judging condition of the step S420 is not satisfied, and the binary search iteration process is not ended. Then, the step S403 is repeatedly done. Whereas, if the number of iterations is 5, the judging condition of the step S420 is satisfied, and the binary search iteration process is ended. Under this circumstance, the control voltage $V_{CTRL}$ is regarded as the worst threshold voltage $V_{TRIM\_E}$ (Step S422). That is, in case that all reference cells are in the erased state, the control voltage $V_{CTRL}$ is regarded as the worst threshold voltage $V_{TRIM\_E}$.

The method of performing the searching action in step of S410 of FIG. 4 may be modified according to the type of the storage device (e.g., an N-type transistor or a P-type transistor) and the storage states of the reference cells.

For example, in case that the storage device is the P-type transistor and the reference cells are maintained in the programmed state, the step S405 is used to judge whether the storage states of all reference cells are the programmed state. According to the judging result of the step S405, the control voltage $V_{CTRL}$ is adjusted (Step S410). If the storage states of all reference cells are the programmed state, the magnitude of the control voltage $V_{CTRL}$ is increased. Whereas, if the reference cells are not all in the programmed state, the magnitude of the control voltage $V_{CTRL}$ is decreased. After judging result of the step S420 indicates that the binary search iteration process is ended, the worst threshold voltage $V_{TRIM\_P}$ of the reference cells in the programmed state is searched.

In the same way, in case that the storage device is an N-type transistor, the similar judging procedures are performed to adjust the control voltage $V_{CTRL}$ and search the worst threshold voltage of the reference cells.

In the above embodiment, the binary search iteration process is used to perform the searching action. In some other embodiment, another search process, such as a direct method, is used to adjust the control voltage $V_{CTRL}$. For example, the storage device is the P-type transistor, and the reference cells are maintained in the erased state. In an embodiment, a higher control voltage is firstly provided by the control voltage generator 220, and thus the reference cells are all determined to be in the erased state. Then, the magnitude of the control voltage $V_{CTRL}$ is gradually decreased. When the control voltage $V_{CTRL}$ is decreased to a specified control voltage $V_{CTRL}$ and at least one of the reference cells is not in the erased state, the specified control voltage $V_{CTRL}$ may be regarded as the worst threshold voltage $V_{TRIM\_E}$. In another embodiment, a lower control voltage is firstly provided by the control voltage generator 220, and thus the reference cells are not all determined to be in the erased state. Then, the magnitude of the control voltage $V_{CTRL}$ is gradually increased. When the control voltage $V_{CTRL}$ is increased to a specified control voltage $V_{CTRL}$ and all of the reference cells are determined to be in the erased state, the specified control voltage $V_{CTRL}$ may be regarded as the worst threshold voltage $V_{TRIM\_E}$.

After the worst threshold voltage is searched, at least one of the control voltage for read action ($V_{CRD}$), the control voltage for program verify ($V_{PV}$) and the control voltage for erase verify ($V_{EV}$) can be determined according to the worst threshold voltage.

FIG. 5A schematically illustrates the relationships between the control voltage for program verify ($V_{PV}$), the control voltage for read action ($V_{CRD}$), the control voltage for erase verify ($V_{EV}$) and the worst threshold voltage $V_{TRIM\_E}$. As shown in FIG. 5A, three voltage differences $\Delta V_1$, $\Delta V_2$ and $\Delta V_3$ are recorded in the control voltage generator 220, and the worst threshold voltage $V_{TRIM\_E}$ of the reference cells in the erased state is searched when the step S405 is to judge that whether the storage states of all reference cells are in the erased state. Consequently, the control voltage for erase verify ($V_{EV}$) is equal to $V_{TRIM\_E}+\Delta V_1$, the control voltage for read action ($V_{CRD}$) is equal to $V_{TRIM\_E}+\Delta V_2$, and the control voltage for program verify ($V_{PV}$) is equal to $V_{TRIM\_E}+\Delta V_3$.

For example, the worst threshold voltage $V_{TRIM\_E}$ is 2.4V, $\Delta V_1$ is 0.2V, $\Delta V_2$ is 0.8V, and $V_3$ is 1.6V. In other words, the control voltage for erase verify ($V_{EV}$) is 2.6V, the control voltage for read action ($V_{CRD}$) is 3.2V, and the control voltage for program verify ($V_{PV}$) is 4.0V. The control voltage for erase verify ($V_{EV}$) is lower than the control voltage for read action ($V_{CRD}$), and the control voltage for read action ($V_{CRD}$) is lower than the control voltage for program verify ($V_{PV}$).

FIG. 5B schematically illustrates the relationships between the control voltage for program verify ($V_{PV}$), the control voltage for read action ($V_{CRD}$), the control voltage for erase verify ($V_{EV}$) and the worst threshold voltage $V_{TRIM\_P}$. As shown in FIG. 5B, three voltage differences $\Delta V_1$, $\Delta V_2$ and $\Delta V_3$ are recorded in the control voltage generator 220, and the worst threshold voltage $V_{TRIM\_P}$ of the reference cells in the programmed state is searched when the step S405 is to judge that whether the storage states of all reference cells are in the programmed state. Consequently, the control voltage for erase verify ($V_{EV}$) is equal to $V_{TRIM\_P}-\Delta V_1$, the control voltage for read action ($V_{CRD}$) is equal to $V_{TRIM\_P}-\Delta V_2$, and the control voltage for program verify ($V_{PV}$) is equal to $V_{TRIM\_P}-\Delta V_3$.

For example, the worst threshold voltage $V_{TRIM\_P}$ is 4.1V, $\Delta V_1$ is +1.5V, $\Delta V_2$ is +1.0V, and $V_3$ is +0.2V. In other words, the control voltage for erase verify ($V_{EV}$) is 2.6V, the control voltage for read action ($V_{CRD}$) is 3.1V, and the control voltage for program verify ($V_{PV}$) is 3.9V. The control voltage for erase verify ($V_{EV}$) is lower than the control voltage for read action ($V_{CRD}$), and the control voltage for read action ($V_{CRD}$) is lower than the control voltage for program verify ($V_{PV}$).

Figures 6A, 6B:
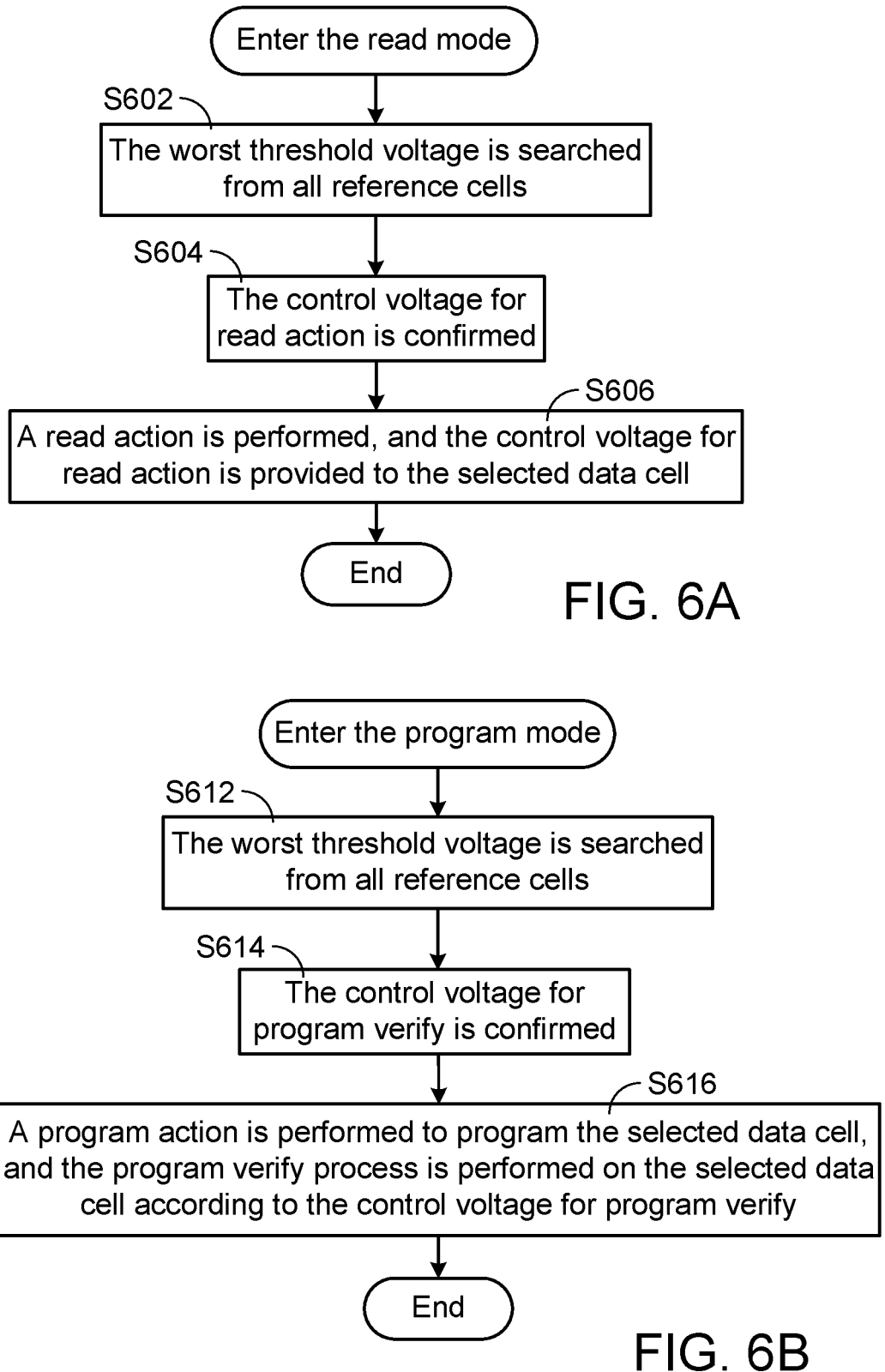
FIG. 6A is a flowchart of a control method for the non-volatile memory according to the embodiment of the present invention when the non-volatile memory is in a read mode.
FIG. 6B is a flowchart of a control method for the non-volatile memory according to the embodiment of the present invention when the non-volatile memory is in a program mode.

FIG. 6A is a flowchart of a control method for the non-volatile memory according to the embodiment of the present invention when the non-volatile memory is in a read mode. After the non-volatile memory 200 enters the read mode, the searching action is performed to search the worst threshold voltage of all reference cells in the non-volatile memory 200 (Step S602). Then, the control voltage for read action ($V_{CRD}$) is determined according to the worst threshold voltage (Step S604). After the control voltage for read action ($V_{CRD}$) is confirmed, a read action is performed, and the control voltage for read action ($V_{CRD}$) is provided to the selected data cell (Step S606). That is, when the read action is performed, the control voltage generator 220 provides the control voltage for read action ($V_{CRD}$) to the selected data cell through the control line CL, and the storage state of the selected data cell is judged and determined.

FIG. 6B is a flowchart of a control method for the non-volatile memory according to the embodiment of the present invention when the non-volatile memory is in a program mode. After the non-volatile memory 200 enters the program mode, the searching action is performed to search the worst threshold voltage of all reference cells in the non-volatile memory 200 (Step S612). Then, the control voltage for program verify ($V_{PV}$) is determined according to the worst threshold voltage (Step S614). Then, a program action is performed to program the selected data cell, and the program verify process is performed on the selected data cell according to the control voltage for program verify ($V_{PV}$) (Step S616). That is, when the program action is performed, the selected data cell is firstly programmed into the programmed state. Then, when the program verify process of the program action is performed, the control voltage generator 220 provides the control voltage for program verify ($V_{PV}$) to the selected data cell through the control line CL, and the non-volatile memory 200 judges whether the selected data cell passes the program verify process.

Figure 6C:
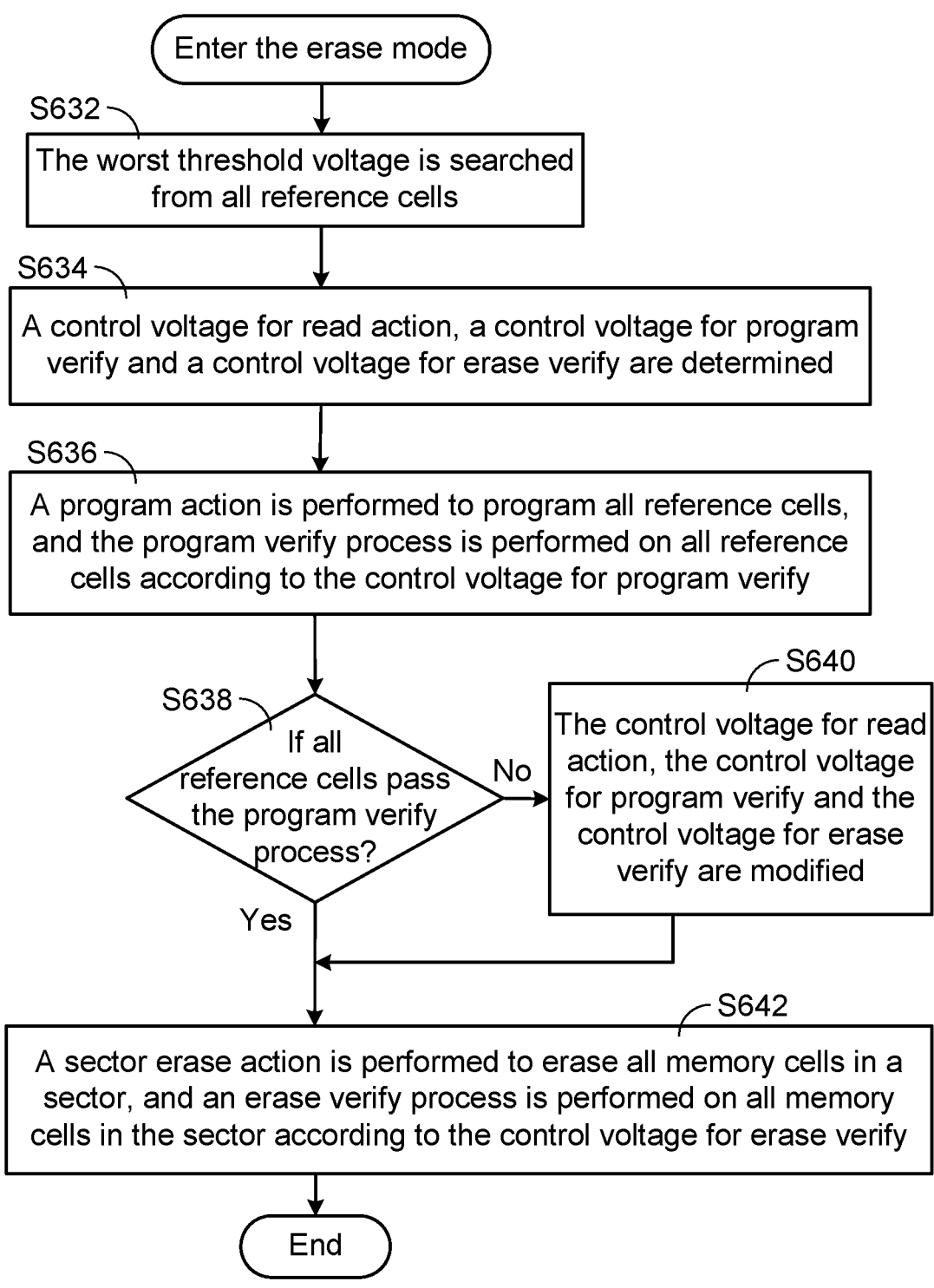
FIG. 6C is a flowchart of a control method for the non-volatile memory in the erase mode, in which the storage device is the P-type transistor and the reference cells are maintained in the erased state.
Figure 6D:
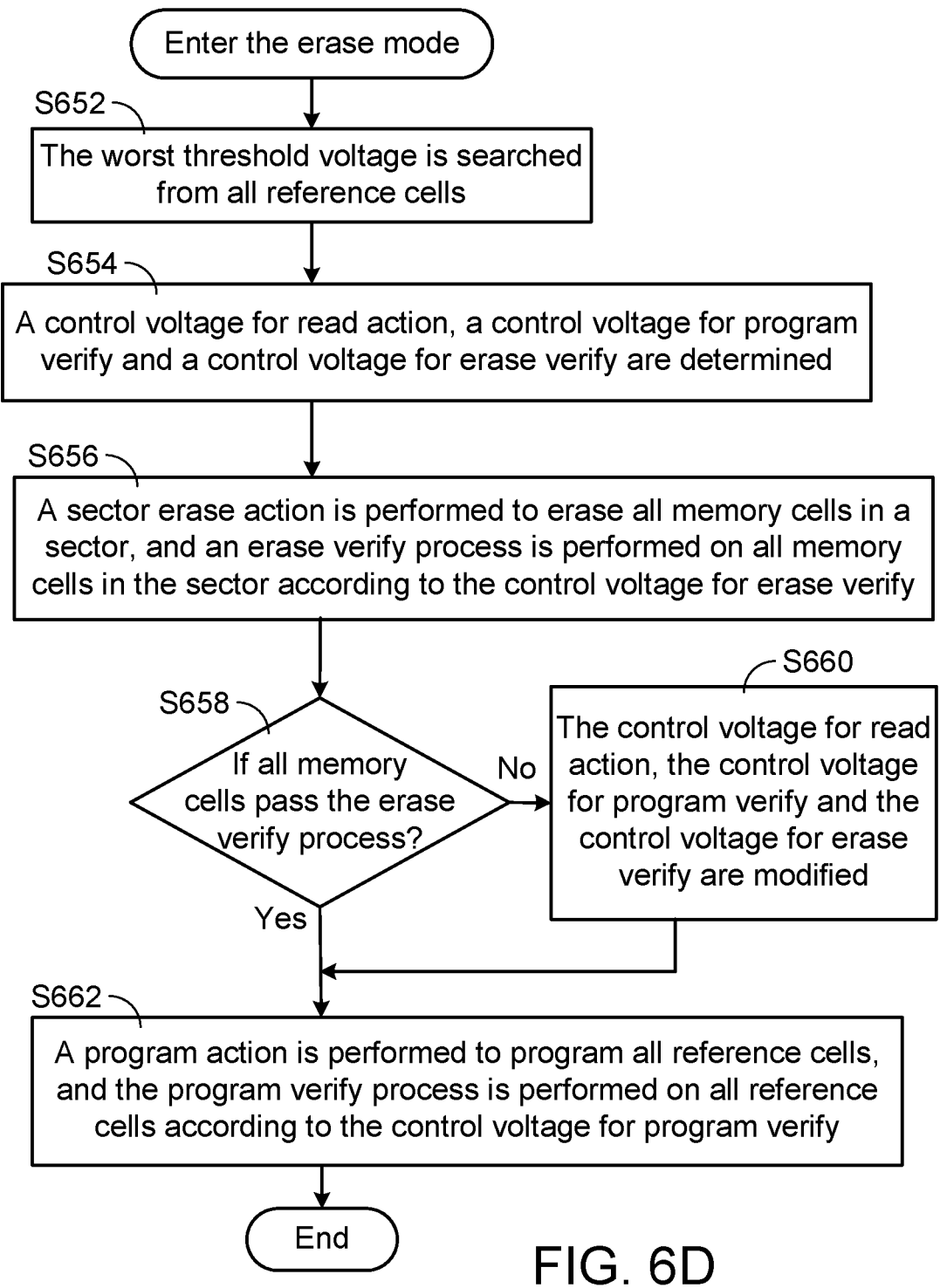
FIG. 6D is a flowchart of a control method for the non-volatile memory in the erase mode, in which the storage device is the P-type transistor and the reference cells are maintained in the programmed state.

FIG. 6C is a flowchart of a control method for the non-volatile memory in the erase mode, in which the storage device is the P-type transistor and the reference cells are maintained in the erased state. FIG. 6D is a flowchart of a control method for the non-volatile memory in the erase mode, in which the storage device is the P-type transistor and the reference cells are maintained in the programmed state. As mentioned above, in the erased mode, the P/E cycling count of each reference cell in the reference cell region 215 of the memory cell array 210 is added by 1. Consequently, the control voltage for read action ($V_{CRD}$), the control voltage for program verify ($V_{PV}$) and the control voltage for erase verify ($V_{EV}$) may be further modified.

In case that the storage device is the P-type transistor and the reference cells are maintained in the erased state, the flowchart of the control method for the non-volatile memory 200 in the erase mode is shown in FIG. 6C. After the non-volatile memory 200 enter the erase mode, the searching action is performed to search the worst threshold voltage of all reference cells in the non-volatile memory 200 (Step S632). Then, the control voltage for read action ($V_{CRD}$), the control voltage for program verify ($V_{PV}$) and the control voltage for erase verify ($V_{EV}$) are determined according to the worst threshold voltage (Step S634). Then, a program action is performed to program all reference cells, and the program verify process is performed on all reference cells according to the control voltage for program verify ($V_{PV}$) (Step S636). That is, after the non-volatile memory 200 enters the erase mode, all reference cells are firstly programmed into the programmed state. Then, when the program verify process of the program action is performed, the control voltage generator 220 provides the control voltage for program verify ($V_{PV}$) to the selected data cell through the control line CL, and the non-volatile memory 200 judges whether all reference cells pass the program verify process (Step S638).

If the judging result of the step S638 indicates that any reference cell fails to pass the program verify process, the control voltage for read action ($V_{CRD}$), the control voltage for program verify ($V_{PV}$) and the control voltage for erase verify ($V_{EV}$) are modified (Step S640). In case that the storage device is the P-type transistor, each of the control voltage for read action ($V_{CRD}$), the control voltage for program verify ($V_{PV}$) and the control voltage for erase verify ($V_{EV}$) is decreased by one voltage increment, for example 0.1V. After the step S640 is completed, the control voltage for read action ($V_{CRD}$), the control voltage for program verify ($V_{PV}$) and the control voltage for erase verify ($V_{EV}$) are decreased.

Whereas, if the judging result of the step S638 indicates that all reference cells pass the program verify process, a sector erase action is performed to erase all memory cells in a sector of the non-volatile memory 200, and an erase verify process is performed on all memory cells in the sector according to the control voltage for erase verify ($V_{EV}$) (Step S642). That is, after the sector erase action is completed, all reference cells in the reference cell region 215 and all data cells in the data cell region 213 are erased into the erased state.

In case that the storage device is the P-type transistor and the reference cells are maintained in the programmed state, the flowchart of the control method for the non-volatile memory 200 in the erase mode is shown in FIG. 6D. After the non-volatile memory 200 enter the erase mode, the searching action is performed to search the worst threshold voltage of all reference cells in the non-volatile memory 200 (Step S652). Then, the control voltage for read action ($V_{CRD}$), the control voltage for program verify ($V_{PV}$) and the control voltage for erase verify ($V_{EV}$) are determined according to the worst threshold voltage (Step S654). Then, a sector erase action is performed to erase all memory cells in a sector of the non-volatile memory 200, and an erase verify process is performed on all memory cells in the sector according to the control voltage for erase verify ($V_{EV}$) (Step S656). Then, when the erase verify process of the erase action is performed, the control voltage generator 220 provides the control voltage for erase verify ($V_{EV}$) to all memory cells through the control line CL, and the non-volatile memory 200 judges whether all memory cells pass the erase verify process (Step S658).

If the judging result of the step S658 indicates that any memory cell fails to pass the erase verify process, the control voltage for read action ($V_{CRD}$), the control voltage for program verify ($V_{PV}$) and the control voltage for erase verify ($V_{EV}$) are modified (Step S660). In case that the storage device is the P-type transistor, each of the control voltage for read action ($V_{CRD}$), the control voltage for program verify ($V_{PV}$) and the control voltage for erase verify ($V_{EV}$) is increased by one voltage increment, for example 0.1V. After the step S660 is completed, the control voltage for read action ($V_{CRD}$), the control voltage for program verify ($V_{PV}$) and the control voltage for erase verify ($V_{EV}$) are increased.

Whereas, if the judging result of the step S658 indicates that all reference cells pass the erase verify process, a program action is performed to program all reference cells, and the program verify process is performed on all reference cells according to the control voltage for program verify ($V_{PV}$) (Step S662). That is, after the program action is completed, all reference cells in the reference cell region 215 are programmed into the programmed state, and all data cells in the data cell region 213 are erased into the erased state.

In some embodiment, since the characteristics of the reference cells are inferior, the step S656 in FIG. 6D may be modified. For example, the modified step S656 is performed to judge whether all reference cells pass the erase verify process.

In the non-volatile memory 200 of FIG. 3A and the above flowcharts, the memory cell array 210 contains a single sector only, and the read action, the program action and the sector erase action are performed on the single sector. In practice, the memory cell array of the non-volatile memory contains plural sectors, and the non-volatile memory can perform the similar read action, program action and sector erase action on any of the sectors in the manner described above.

In another embodiment, the memory cell array of the non-volatile memory contains plural sectors. After the non-volatile memory enters one of various operating mode, the control method for performing the corresponding actions may be modified. The associated control method will be described as follows.

Figure 7:
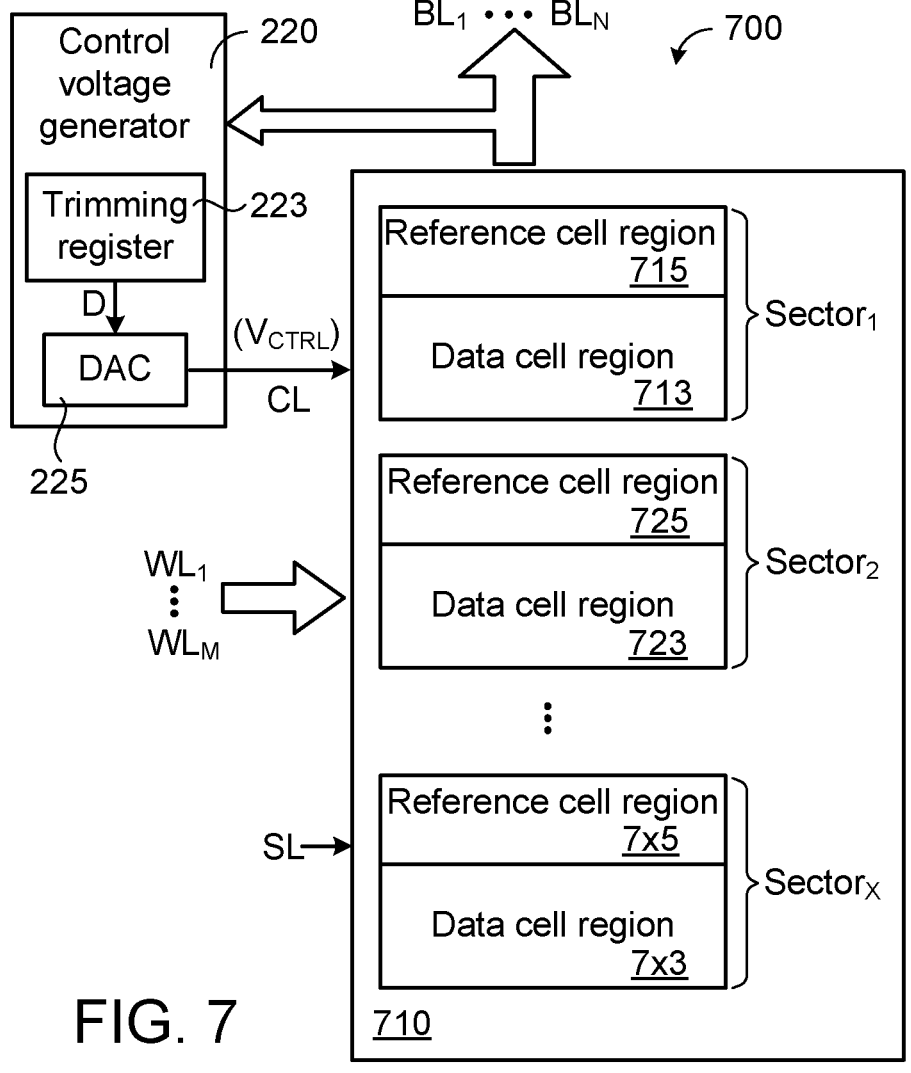
FIG. 7 is a schematic circuit block diagram illustrating a non-volatile memory according to another embodiment of the present invention.

FIG. 7 is a schematic circuit block diagram illustrating a non-volatile memory according to another embodiment of the present invention. In this embodiment, the non-volatile memory 700 comprises a memory cell array 710 and a control voltage generator 220. In comparison with the non-volatile memory of FIG. 3A, the memory cell array 710 comprises plural sectors Sector$_1$~Sector$_x$. The first sector Sector$_1$ comprises a reference cell region 715 and a data cell region 713. The second sector Sector$_2$ comprises a reference cell region 725 and a data cell region 723. The rest may be deduced by analogy. The x-th sector Sector$_x$ comprises a reference cell region 7$x$5 and a data cell region 7$x$3.

When one of various actions is performed, the worst threshold voltage of all reference cells is searched in the individual sector. For example, when the read action, the program action and the sector erase action is performed on the data cells in the first sector Sector$_1$, the worst threshold voltage of all reference cells is searched in the reference cell region 715 of the first sector Sector$_1$. Then, the control voltage for read action ($V_{CRD}$), the control voltage for program verify ($V_{PV}$) and the control voltage for erase verify ($V_{EV}$) are determined and applied to the data cells in the data cell region 713 of the first sector Sector$_1$.

In addition to the searching action on the reference cells in the first sector Sector$_1$, the searching action can be performed on the reference cells in the reference cell region 725~7$x$5 of the other sectors Sector$_2$~Sector$_x$ in order to determine the worst threshold voltage. Consequently, the correctness of the data in the memory cells can be effectively enhanced. In other words, after all reference cells in the reference cell region 715~7$x$5 of the memory cell array 710 are searched, the worst threshold voltage is determined. In addition, the control voltage for read action ($V_{CRD}$), the control voltage for program verify ($V_{PV}$) and the control voltage for erase verify ($V_{EV}$) are determined according to the worst threshold voltage.

From the above descriptions, the present invention provides the control method for the non-volatile memory. The reference cells are maintained in the first storage state. When the non-volatile memory is subjected to the sector erase action, the data cells are changed to the erased state, and the reference cells are firstly changed from the first storage state to a second storage state and then changed from the second storage state to the first storage state. Since the P/E cycling count of each reference cell is added by 1, it can be assured that the characteristics of the reference cells are inferior. The first storage state and the second storage state are different storage states. For example, in case that the first storage state is the erased state, the second storage state is the programmed state. Whereas, in case that the first storage state is the programmed state, the second storage state is the erased state.

Furthermore, when the searching action is performed, the worst threshold voltage is searched from the reference cells. The control voltage for read action, the control voltage for program verify and the control voltage for erase verify are determined according to the worst threshold voltage. Consequently, the correctness of the data in the memory cells can be effectively enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control method for a non-volatile memory, the non-volatile memory comprising a memory cell array, the memory cell array comprising plural reference cells and plural data cells, the plural reference cells being maintained in a first storage state, the control method comprising steps of:

(a1) judging whether the non-volatile memory enters a read mode, a program mode or an erase mode after the non-volatile memory is enabled;

(a2) if a judging result of the step (a1) indicates that the non-volatile memory enters the read mode, the program mode or the erase mode, searching a worst threshold voltage of the plural reference cells;

(a3) determining at least one of a control voltage for read action, a control voltage for program verify and a control voltage for erase verify according to the worst threshold voltage; and (a4) performing a read action, a program action or an erase action on the plural data cells;

wherein when the erase action is performed, the plural data cells are changed to an erased state, and the plural reference cells are changed from the first storage state to a second storage state and then changed from the second storage state to the first storage state, and a program/erase cycling count of each of the plural reference cells is added by 1.

2. The control method as claimed in claim 1, wherein the non-volatile memory further comprises a control voltage generator, and each of the plural reference cells and each of the plural data cells comprises a storage device, wherein the control voltage generator is connected with the storage devices of the plural reference cells and the storage devices of the plural data cells through a control line.

3. The control as claimed in claim 2, wherein the control voltage generator comprises:

an adjusting register for temporarily storing a digital number and outputting the digital number; and a digital-to-analog converter receiving the digital number, and generating a control voltage according to the digital number, wherein the control voltage is served as the control voltage for read action, the control voltage for program verify and the control voltage for erase verify.

4. The control method as claimed in claim 2, wherein the storage device is a stacked-gate floating gate transistor, and a control gate of the stacked-gate floating gate transistor is connected with the control line.

5. The control method as claimed in claim 2, wherein the storage device comprises a floating gate transistor and a capacitor, wherein a floating gate of the floating gate transistor is connected with a first terminal of the capacitor, and a second terminal of the capacitor is connected with the control line.

6. The control method as claimed in claim 2, wherein the storage device is a SONOS transistor, wherein a gate dielectric layer of the SONOS transistor is an oxide layer-nitride layer-oxide layer stack structure, and a gate terminal of the SONOS transistor is connected with the control line.

7. The control as claimed in claim 2, wherein the step (a2) comprises steps of:

(b1) controlling the voltage generator to load a predetermined voltage as a control voltage;

(b2) providing the control voltage to the plural reference cells;

(b3) judging whether the plural reference cells are in the first storage state;

(b4) the control voltage generator adjusting the control voltage according to a judging result of the step (b3);

(b5) judging whether a binary search iteration process is ended;

(b6) if a judging result of the step (b5) indicates that the binary search iteration process is not ended, performing the step (b2) again; and (b7) if the judging result of the step (b5) indicates that the binary search iteration process is ended, determining the control voltage as the worst threshold voltage.

8. The control as claimed in claim 7, wherein the storage device comprises a P-type transistor, and the first storage state is the erased state, wherein the step (b4) comprises steps of:

if the plural reference cells are all in the erased state, the control voltage generator decreasing the control voltage; and if the plural reference cells are not all in the erased state, the control voltage generator increasing the control voltage.

9. The control as claimed in claim 7, wherein the storage device comprises a P-type transistor, and the first storage state is a programmed state, wherein the step (b4) comprises steps of:

if the plural reference cells are all in the programmed state, the control voltage generator increasing the control voltage; and if the plural reference cells are not all in the programmed state, the control voltage generator decreasing the control voltage.

10. The control method as claimed in claim 2, wherein a first voltage difference, a second voltage difference and a third voltage difference are recorded in the control voltage generator, wherein the control voltage for erase verify is equal to a sum of the worst threshold voltage and the first voltage difference, the control voltage for read action is equal to a sum of the worst threshold voltage and the second voltage difference, and the control voltage for program verify is equal to a sum of the worst threshold voltage and the third voltage difference.

11. The control method as claimed in claim 2, wherein when the non-volatile memory enters the read mode and the read action is performed in the step (a4), the control voltage generator provides the control voltage for read action determined in the step (a3) to a selected data cell of the plural data cells, and the selected data cell is determined as a programmed state or the erased state according to the control voltage for read action.

12. The control method as claimed in claim 2, wherein when the non-volatile memory enters the program mode and the program action is performed in the step (a4), a selected data cell of the plural data cells is programmed, the control voltage generator provides the control voltage for program verify determined in the step (a3) to the selected data cell, and a program verify process is performed according to control voltage for program verify.

13. The control as claimed in claim 2, wherein a first sector of the memory cell array comprises the plural reference cells and the plural data cells, and the first storage state is the erased state, wherein when the non-volatile memory enters the erase mode, the step of performing the erase action in the step (a4) comprises steps of:

(c1) performing the program action to program the plural reference cells;

(c2) performing a program verify process on all of the plural reference cells according to the control voltage for program verify determined in the step (a3);

(c3) if the plural reference cells fail to pass the program verify process, modifying the control voltage for read action, the control voltage for program verify and the control voltage for erase verify; performing a sector erase action to erase all of the plural reference cells and all of the plural data cells in the first sector; providing the control voltage for erase verify to the plural reference cells and the plural data cells; and performing an erase verify process on the plural reference cells and the plural data cells according to the control voltage for erase verify; and (c4) if all of the plural reference cells pass the program verify process, performing a sector erase action to erase all of the plural reference cells and all of the plural data cells in the first sector; providing the control voltage for erase verify to the plural reference cells and the plural data cells; and performing the erase verify process on the plural reference cells and the plural data cells according to the control voltage for erase verify.

14. The control method as claimed in claim 13, wherein the storage device comprises a P-type transistor, wherein in the step (c3), each of the control voltage for read action, the control voltage for program verify and the control voltage for erase verify is decreased by one voltage increment.

15. The control as claimed in claim 2, wherein a first sector of the memory cell array comprises the plural reference cells and the plural data cells, and the first storage state is a programmed state, wherein when the non-volatile memory enters the erase mode, the step of performing the erase action in the step (a4) comprises steps of:

(d1) performing a sector erase action to erase all of the plural reference cells and all of the plural data cells in the first sector;

(d2) providing the control voltage for erase verify determined in the step (a3) to the plural reference cells and the plural data cells, and performing an erase verify process on the plural reference cells and the plural data cells according to the control voltage for erase verify;

(d3) if the plural reference cells fail to pass the erase verify process, modifying the control voltage for read action, the control voltage for program verify and the control voltage for erase verify; performing the program action to program the plural reference cells; providing the control voltage for program verify to the plural reference cells; and performing a program verify process on the plural reference cells according to the control voltage for program verify; and (d4) if all of the plural reference cells pass the erase verify process, performing the program action to program the plural reference cells; providing the control voltage for program verify to the plural reference cells; and performing the program verify process on the plural reference cells according to the control voltage for program verify.

16. The control method as claimed in claim 15, wherein the storage device comprises a P-type transistor, wherein in the step (d3), each of the control voltage for read action, the control voltage for program verify and the control voltage for erase verify is increased by one voltage increment.

17. A control method for a non-volatile memory, the non-volatile memory comprising a memory cell array and a control voltage generator, the memory cell array comprising plural reference cells and plural data cells connected with the control voltage generator, each of the plural reference cells and each of the plural data cells comprising a storage device, the plural reference cells being maintained in a first storage state, and the control method comprising steps of:

(a1) searching a worst threshold voltage of the plural reference cells;

(a2) determining at least one of a control voltage for read action, a control voltage for program verify and a control voltage for erase verify according to the worst threshold voltage; and (a3) providing the control voltage for read action to the memory cell array when a read action is performed, providing the control voltage for program verify to the memory cell array when a program verify process is performed, or providing the control voltage for erase verify to the memory cell array when an erase verify process is performed;

wherein the step (a1) comprises steps of:

(b1) controlling the voltage generator to load a predetermined voltage as a control voltage;

(b2) providing the control voltage to the plural reference cells;

(b3) judging whether the plural reference cells are in the first storage state;

(b4) the control voltage generator adjusting the control voltage according to a judging result of the step (b3);

(b5) judging whether a search process is ended;

(b6) if a judging result of the step (b5) indicates that the search process is not ended, performing the step (b2) again; and (b7) if the judging result of the step (b5) indicates that the search process is ended, determining the control voltage as the worst threshold voltage.

18. The control as claimed in claim 17, wherein the storage device comprises a P-type transistor, and the first storage state is an erased state, wherein the step (b4) comprises steps of:

if the plural reference cells are all in the erased state, the control voltage generator decreasing the control voltage; and if the plural reference cells are not all in the erased state, the control voltage generator increasing the control voltage.

19. The control as claimed in claim 17, wherein the storage device comprises a P-type transistor, and the first storage state is a programmed state, wherein the step (b4) comprises steps of:

if the plural reference cells are all in the programmed state, the control voltage generator increasing the control voltage; and if the plural reference cells are not all in the programmed state, the control voltage generator decreasing the control voltage.

20. The control method as claimed in claim 17, wherein a first voltage difference, a second voltage difference and a third voltage difference are recorded in the control voltage generator, wherein the control voltage for erase verify is equal to a sum of the worst threshold voltage and the first voltage difference, the control voltage for read action is equal to a sum of the worst threshold voltage and the second voltage difference, and the control voltage for program verify is equal to a sum of the worst threshold voltage and the third voltage difference.

21. The control method as claimed in claim 17, wherein when the read action is performed in the step (a3), the control voltage generator provides the control voltage for read action to a selected data cell of the plural data cells, and the selected data cell is determined as a programmed state or an erased state according to the control voltage for read action.

22. The control method as claimed in claim 17, wherein when a program action is performed, a selected data cell of the plural data cells is programmed, the control voltage generator provides the control voltage for program verify to the selected data cell, and the program verify process is performed according to the control voltage for program verify.

23. The control as claimed in claim 17, wherein a first sector of the memory cell array comprises the plural reference cells and the plural data cells, and the first storage state is an erased state, wherein an erase action of the non-volatile memory comprises steps of:

(c1) performing a program action to program the plural reference cells;

(c2) performing the program verify process on all of the plural reference cells according to the control voltage for program verify;

(c3) if the plural reference cells fail to pass the program verify process, modifying the control voltage for read action, the control voltage for program verify and the control voltage for erase verify; performing a sector erase action to erase all of the plural reference cells and all of the plural data cells in the first sector; providing the control voltage for erase verify to the plural reference cells and the plural data cells; and performing an erase verify process on the plural reference cells and the plural data cells according to the control voltage for erase verify; and (c4) if all of the plural reference cells pass the program verify process, performing the sector erase action to erase all of the plural reference cells and all of the plural data cells in the first sector; providing the control voltage for erase verify to the plural reference cells and the plural data cells; and performing an erase verify process on the plural reference cells and the plural data cells according to the control voltage for erase verify.

24. The control as claimed in claim 17, wherein a first sector of the memory cell array comprises the plural reference cells and the plural data cells, and the first storage state is a programmed state, wherein an erase action of the non-volatile memory comprises steps of:

(d1) performing a sector erase action to erase all of the plural reference cells and all of the plural data cells in the first sector;

(d2) providing the control voltage for erase verify to the plural reference cells and the plural data cells, and performing the erase verify process on the plural reference cells and the plural data cells according to the control voltage for erase verify;

(d3) if the plural reference cells fail to pass the erase verify process, modifying the control voltage for read action, the control voltage for program verify and the control voltage for erase verify; performing a program action to program the plural reference cells; providing the control voltage for program verify to the plural reference cells; and performing the program verify process on the plural reference cells according to the control voltage for program verify; and (d4) if all of the plural reference cells pass the erase verify process, performing the program action to program the plural reference cells; providing the control voltage for program verify to the plural reference cells; and performing the program verify process on the plural reference cells according to the control voltage for program verify.

* * * * *